(12) United States Patent
Cronin et al.

(10) Patent No.: US 10,429,445 B2
(45) Date of Patent: Oct. 1, 2019

(54) METHOD AND SYSTEM FOR PROVIDING CHARGING INFORMATION TO A USER OF A WEARABLE DEVICE

(71) Applicant: KONINKLIJKE PHILIPS N.V., Eindhoven (NL)

(72) Inventors: John Cronin, Bonita Springs, FL (US); Joseph Bodkin, Williston, VT (US); Jonathan T. Goguen, Brookline, NH (US); Christopher Huffines, Williston, VT (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/559,450

(22) PCT Filed: Mar. 25, 2016

(86) PCT No.: PCT/EP2016/056690
§ 371 (c)(1),
(2) Date: Sep. 19, 2017

(87) PCT Pub. No.: WO2016/151130
PCT Pub. Date: Sep. 29, 2016

(65) Prior Publication Data
US 2018/0113172 A1    Apr. 26, 2018

Related U.S. Application Data

(60) Provisional application No. 62/138,214, filed on Mar. 25, 2015.

(30) Foreign Application Priority Data

Aug. 7, 2015   (EP) ................................. 15180103

(51) Int. Cl.
*H02J 7/00*       (2006.01)
*G01R 31/36*     (2019.01)
(Continued)

(52) U.S. Cl.
CPC ..... *G01R 31/3648* (2013.01); *G01R 31/3646* (2019.01); *G06F 1/26* (2013.01); *G06Q 10/109* (2013.01); *H02J 7/0047* (2013.01)

(58) Field of Classification Search
USPC ........................................................ 320/132
See application file for complete search history.

(56) References Cited

U.S. PATENT DOCUMENTS 8,655,307 B1    2/2014   Walker
2008/0201587 A1   8/2008   Lee
(Continued)

FOREIGN PATENT DOCUMENTS

GB     2489572 A    10/2012

OTHER PUBLICATIONS

Observations on the PCT International Search Report and the Written Opinion of International Application No. PCT/EP2016/056690, James J. Bitetto, dated Jul. 14, 2016.
(Continued)

*Primary Examiner* — Samuel Berhanu

(57) ABSTRACT

A method and system for providing charging information to a user of wearable device by predicting when a health sensor is needed most during the course of the day and cross-referencing that information with a user's personal calendar in order to determine the optimal time to charge the wearable device. Battery life of the wearable device may be monitored. Information may be stored in memory regarding sensor data detected by one or more sensors and associated with a time. One or more time slots may be identified during which the sensor data was lacking. The identified time slots
(Continued)

may be compared against a calendar of available time to identify matching time slots. A next matching time slot may be determined, and a notification may be displayed on a display screen of the wearable device to recommend that the user charge the wearable device at the determined next matching time slot.

15 Claims, 13 Drawing Sheets

(51) Int. Cl.
*G06Q 10/10* (2012.01)
*G06F 1/26* (2006.01)

(56) References Cited

U.S. PATENT DOCUMENTS

| | | |
|---|---|---|
| 2011/0207509 A1 | 8/2011 | Crawford |
| 2014/0221790 A1 | 8/2014 | Pacione |
| 2014/0247137 A1* | 9/2014 | Proud ................. G06F 19/3418 340/870.01 |
| 2015/0115871 A1* | 4/2015 | Feril ...................... H04R 1/105 320/103 |
| 2015/0326045 A1* | 11/2015 | Choi ..................... H02J 7/0044 320/107 |

OTHER PUBLICATIONS

PCT International Search Report, International Application No. PCT/EP2016/056690, dated Mar. 25, 2016.

* cited by examiner

Wearable Device – Database 500

| ID | Date | Time | Blood Pressure | Pulse | Temperature | Respiratory Rate | Accelerometer | GPS | Battery Percentage |
|---|---|---|---|---|---|---|---|---|---|
| JSXXXX | 2/24/2015 | 9:00AM | 85/55 | 85 | 98.6 | 13/Min | XXX | X,Y,Z | 100% |
| JSXXXX | 2/24/2015 | 9:05AM | 86/56 | 87 | 98.5 | 13/Min | XXX | X,Y,Z | 99% |
| JSXXXX | 2/24/2015 | 9:10AM | 89/60 | 89 | 98.4 | 14/Min | XXX | X,Y,Z | 98% |
| JSXXXX | 2/24/2015 | 9:15AM | 85/52 | 86 | 98.5 | 13/Min | XXX | X,Y,Z | 97% |
| JSXXXX | 2/24/2015 | 9:20AM | 81/45 | 84 | 98.4 | 12/Min | XXX | X,Y,Z | 96% |
| JSXXXX | 2/24/2015 | 9:25AM | 80/46 | 82 | 98.5 | 12/Min | XXX | X,Y,Z | 95% |
| JSXXXX | 2/24/2015 | 9:30AM | 83/50 | 81 | 98.6 | 13/Min | XXX | X,Y,Z | 94% |
| JSXXXX | 2/24/2015 | 9:35AM | 87/52 | 80 | 98.6 | 14/Min | XXX | X,Y,Z | 93% |
| JSXXXX | 2/24/2015 | 9:40AM | 91/63 | 79 | 98.5 | 13/Min | XXX | X,Y,Z | 92% |
| JSXXXX | 2/24/2015 | 9:45AM | 94/65 | 84 | 98.6 | 14/Min | XXX | X,Y,Z | 91% |
| JSXXXX | 2/24/2015 | 9:50AM | 95/66 | 86 | 98.5 | 13/Min | XXX | X,Y,Z | 90% |
| JSXXXX | 2/24/2015 | 9:55AM | 92/59 | 89 | 98.4 | 12/Min | XXX | X,Y,Z | 89% |
| JSXXXX | 2/24/2015 | 10:00AM | 90/60 | 91 | 98.5 | 11/Min | XXX | X,Y,Z | 88% |
| JSXXXX | 2/24/2015 | 10:05AM | 93/65 | 93 | 98.6 | 13/Min | XXX | X,Y,Z | 87% |

Wearable Device – Automatic Readings Database 510

| Pulse | Temperature | Blood Pressure | Respiratory Rate | Accelerometer | GPS |
|---|---|---|---|---|---|
| 70 | 98.6 | 85/55 | 13/min | XXX | X,Y,Z |

FIG. 5

Wearable Device – Calendar Database 700

| Week of 2/22/2015 | 12am | 1am | 2am | 3am | 4am | 5am | 6am | 7am | 8am | 9am | 10am | 11am | 12pm | 1pm | 2pm | 3pm | 4pm | 5pm | 6pm | 7pm | 8pm | 9pm | 10pm | 11pm |
|---|---|---|---|---|---|---|---|---|---|---|---|---|---|---|---|---|---|---|---|---|---|---|---|---|
| Sunday | O | O | O | O | O | O | O | O | O | O | O | O | O | O | O | O | O | O | O | O | O | O | O | O |
| Monday | O | O | O | O | O | O | O | O | O | X | X | X | X | X | X | O | O | O | O | O | O | O | O | O |
| Tuesday | O | O | O | O | O | O | O | O | O | O | X | X | X | O | X | X | O | O | O | O | O | O | O | O |
| Wednesday | O | O | O | O | O | O | O | O | X | X | X | X | O | X | X | O | O | X | X | O | O | O | O | O |
| Thursday | O | O | O | O | O | O | O | O | O | O | O | X | X | O | X | X | X | X | O | O | O | O | O | O |
| Friday | O | O | O | O | O | O | O | X | X | X | O | O | O | X | O | O | O | O | O | O | X | X | O | O |
| Saturday | O | O | O | O | O | O | O | O | O | O | O | O | O | O | O | O | O | O | O | O | O | O | O | O |

X = Unavailable Time Slot
O = Free Time Slot

FIG. 7

METHOD AND SYSTEM FOR PROVIDING CHARGING INFORMATION TO A USER OF A WEARABLE DEVICE

CROSS-REFERENCE TO RELATED APPLICATIONS

The present application claims the priority benefit under 35 U.S.C. § 371 of International Patent Application No. PCT-EP2016/056690, filed Mar. 25, 2016, which claims the benefit of European Patent Application No. EP15180102.2, filed on Aug. 7, 2015, and claims the priority benefit of U.S. Provisional Patent Application No. 62/138,214 filed Mar. 25, 2015. These applications are hereby incorporated by reference herein in their entirety.

FIELD OF THE INVENTION

The present disclosure generally relates to wearable technology. More specifically, the present disclosure relates to calendar-based charging system for wearable devices.

BACKGROUND

Wearable electronic devices, or as used herein, wearable technology is a new class of electronic systems that can provide data acquisition through a variety of unobtrusive sensors that may be worn by a user. The sensors gather information, for example, about the environment, the user's activity, or the user's health status. However, there are significant challenges related to the coordination, computation, communication, privacy, security, and presentation of the collected data. Additionally, there are challenges related to power management given the current state of battery technology. Furthermore, analysis of the data is needed to make the data gathered by the sensors useful and relevant to end-users. In some cases, additional sources of information may be used to supplement the data gathered by the sensors. The many challenges that wearable technology presents require new designs in hardware and software.

Wearable technology may include any type of mobile electronic device that can be worn on the body, that is attached to or embedded in clothes, and various other accessories of an individual. This wearable technology currently exists in the consumer marketplace. Processors and sensors associated with the wearable technology can display, process, and/or gather information. Such wearable technology has been used in a variety of areas, including monitoring health of the user as well as collecting other types of data and statistics. These types of devices may be readily available to the public and may be easily purchased by consumers. Examples of some wearable technology in the health arena include FitBit®, Nike+ FuelBand®, and the Apple Watch®.

Currently available wearable devices are known to have issues with respect to power consumption and battery life. In that regard, past solutions have involved allowing the user tools for monitoring battery status and predicting when an electronic device may lose power. Further, some presently available devices provide power management alerts and options of when to charge device based on battery usage and power usage of certain functions (e.g., that may be particularly power-intensive). However, these existing solutions are ineffective.

Accordingly, there is a continued need in the art for wearable device solutions that provide charging information to a user of the wearable device in order to facilitate charging and the scheduling of charging.

SUMMARY

The present disclosure is directed to inventive systems and methods for providing charging information to a user of wearable devices by predicting when a sensor or other function is needed most during the course of the day and cross-referencing that information with a user's personal calendar in order to determine an optimal time to charge the wearable device. Battery life of the wearable device may be monitored. Information may be stored in memory regarding sensor data detected by one or more sensors and associated with a time. One or more time slots may be identified during which the sensor data was lacking. The identified time slots may be compared against a calendar of available time to identify matching time slots. A next matching time slot may be determined, and a notification may be displayed on a display screen of the wearable device to recommend that the user charge the wearable device at the determined next matching time slot.

A first aspect of the present invention includes a computer-implemented method for providing charging information to a user of wearable devices. The method comprises detecting sensor data by one or more sensors of a wearable device; storing the sensor data detected in memory of the wearable device, wherein the sensor data is associated with a time information indicating the time slot in a day that said sensor data is detected; identifying one or more time slots in a day during which the sensor was inactive based on the time information associated with the sensor data or during which the sensor data was stagnant over a predetermined period of time, comparing the identified time slots against a predetermined calendar-based schedule information to determine a matching time slot, and displaying a notification on a display screen of the wearable device for recommending to a user to charge the wearable device at the determined matching time slot.

A second aspect of the present invention includes a wearable device. The wearable device comprises a battery; one or more sensors for detecting sensor data of a user of the wearable device; memory configured for storing the sensor data detected in memory of the wearable device, wherein the sensor data is associated with a time information indicating the time slot in a day that said sensor data is detected; a processor configured for identifying one or more time slots in a day during which the sensor was inactive based on the time information associated with the sensor data or during which the sensor data was stagnant over a predetermined period of time; comparing the identified time slots against a predetermined calendar-based schedule information to determine a matching time slot; and a display configured for displaying a notification for recommending to the user of the wearable device to charge the wearable device at the determined matching time slot.

A third aspect of the present invention includes a non-transitory computer-readable storage medium, having embodied thereon a program executable by a processor to perform a method for providing charging information to a user of wearable devices. The method comprises detecting sensor data by one or more sensors of a wearable device; storing the sensor data detected in memory of the wearable device, wherein the sensor data is associated with a time information indicating the time slot in a day that said sensor data is detected; identifying one or more time slots in a day during which the sensor was inactive based on the time information associated with the sensor data or during which the sensor data was stagnant over a predetermined period of time, comparing the identified time slots against a predetermined calendar-based schedule information to determine a matching time slot, displaying a notification on a display screen of the wearable device for recommending to a user to charge the wearable device at the determined matching time slot.

According to an aspect is a computer-implemented method for providing charging information to a user of a wearable device. The method includes the steps of: (i) providing a wearable device comprising one or more sensors, a processor, and a memory; (ii) obtaining sensor data from the one or more sensors of the wearable device; (iii) storing the sensor data in a memory of the wearable device, wherein the sensor data is associated with a time information indicating a time slot that said sensor data is obtained; (iv) identifying one or more sensor-based time slots, based on the sensor data and the time information associated with the sensor data, during which charging of the wearable device would be optimal; (v) receiving calendar-based schedule information; (vi) identifying one or more calendar-based time slots, based on the received calendar-based schedule information, during which charging of the wearable device would be optimal; (vii) comparing the identified one or more sensor-based time slots and the one or more calendar-based time slots to determine an matching optimal time slot; and (viii) notifying the user to charge the wearable device at the determined matching optimal time slot.

According to an embodiment, the method further includes the steps of monitoring a remaining charge of the battery of the wearable device, and generating a prediction as to when the remaining charge of the battery of the wearable device will expire; where the step of notifying the user to charge the wearable device at the determined matching optimal time slot further includes the generated prediction.

According to an embodiment, the method further includes the step of receiving user input regarding a charging basis, wherein the charging basis is one of a sensor-based charging basis, a calendar-based charging basis, and a combination of a sensor-based charging basis and a calendar-based charging basis.

According to an embodiment, the method further includes the step of determining whether one or more sensors of the wearable device are inactive.

According to an embodiment, sensor data from at least two of the one or more sensors of the wearable device are in conflict, and where the method further comprises the step of referring to a priority list designating a priority to be consulted when at least two of the one or more sensors of the wearable device are in conflict.

According to an embodiment, the determined matching optimal time slot is based at least in part on the priority list.

According to an embodiment, the calendar-based schedule information is provided by the user.

According to an embodiment, the user input indicates that the charging basis includes a calendar-based charging basis, and the method further comprises the step of referring to one or more user-provided schedules from the predetermined calendar-based schedule information.

According to an embodiment, the calendar-based schedule information is retrieved from a calendar database remote from the wearable device.

According to an aspect is a wearable device including a battery, one or more sensors configured to obtain sensor data, and a memory configured to store: the obtained sensor data, wherein the sensor data is associated with a time information indicating the time slot that said sensor data is obtained; and further configured to store calendar-based schedule information. The wearable device further includes a processor configured to: identify one or more sensor-based time slots, based on the sensor data, during which charging of the wearable device would be optimal; identify one or more calendar-based time slots, based on the stored calendar-based schedule information, during which charging of the wearable device would be optimal; compare the identified one or more sensor-based time slots and the one or more calendar-based time slots to determine a matching optimal time slot for charging the wearable device; and generate a notification to a user to charge the wearable device at the determined matching optimal time slot.

According to an embodiment, the device further includes a display configured to display the generated notification.

According to an embodiment, the determined matching optimal time slot is based at least in part on a user-defined priority list.

According to an aspect is a non-transitory computer-readable storage medium, having embodied thereon a program executable by a processor to perform a method for providing charging information to a user of wearable device. According to an embodiment, the method includes the steps of: (i) providing a wearable device comprising one or more sensors, a processor, and a memory; (ii) obtaining sensor data from the one or more sensors of the wearable device; (iii) storing the sensor data in a memory of the wearable device, wherein the sensor data is associated with a time information indicating a time slot that said sensor data is obtained; (iv) identifying one or more sensor-based time slots, based on the sensor data and the time information associated with the sensor data, during which charging of the wearable device would be optimal; (v) receiving calendar-based schedule information; (vi) identifying one or more calendar-based time slots, based on the received calendar-based schedule information, during which charging of the wearable device would be optimal; (vii) comparing the identified one or more sensor-based time slots and the one or more calendar-based time slots to determine an matching optimal time slot; and (viii) notifying the user to charge the wearable device at the determined matching optimal time slot.

As used herein for purposes of the present disclosure, the term "controller" is used generally to describe various apparatus relating to the operation of a ventilator apparatus, system, or method. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, track balls, display screens, various types of graphical user interfaces (GUIs), touch screens, microphones and other types of sensors that may receive some form of human-generated stimulus and generate a signal in response thereto.

Various embodiments of the present invention may further include non-transitory computer-readable storage media, having embodied thereon a firewall program executable by a processor to perform methods described herein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

These and other aspects will be apparent from and elucidated with reference to the embodiment(s) described hereinafter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure.

FIG. 5 is a database that may be used in a wearable device, in accordance with an embodiment.

FIG. 7 is a calendar database that may be used in a wearable device, in accordance with an embodiment.

DETAILED DESCRIPTION OF EXEMPLARY EMBODIMENTS

Embodiments set forth herein include systems and methods for calendar-based charging for wearable devices. Battery life of the wearable device may be monitored. Information may be stored in memory regarding past sensor data detected by one or more sensors and associated with a time. One or more time slots may be identified during which the past sensor data was lacking or during which the past sensor data was stagnant over a predetermined period of time. The identified time slots may be compared against a calendar of available time to identify matching time slots. A next matching time slot may be determined, and a notification may be displayed on a display screen of the wearable device to recommend that the user charge the wearable device at the determined next matching time slot.

Figure 1:
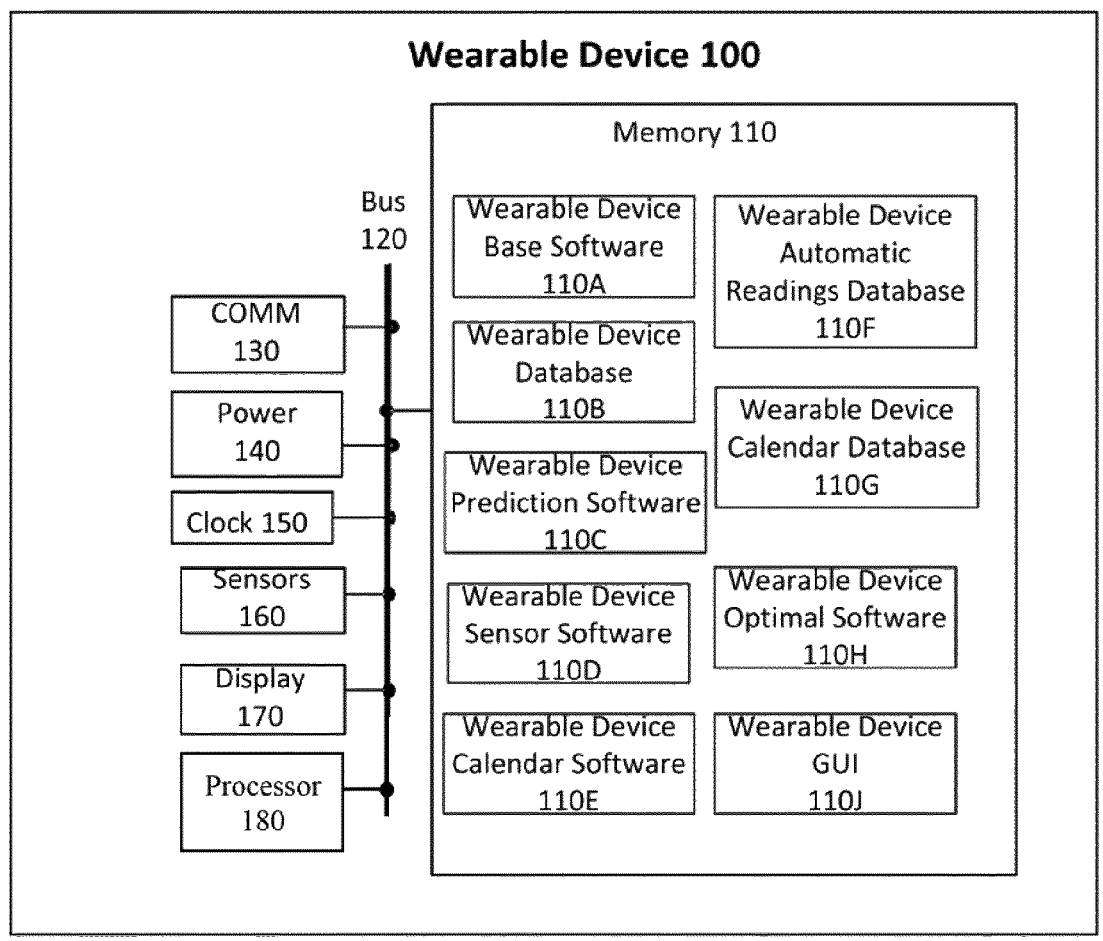
FIG. 1 is a block diagram of a wearable device that may be used in a system for calendar-based charging for wearable devices, in accordance with an embodiment.

FIG. 1 is a block diagram of a wearable device 100 that may be used in a system for calendar-based charging for wearable devices. Such a wearable device 100 may include a processor 180 and a memory 110, the memory including base software 110A, database 110B, prediction software 110C, sensor software 110D, calendar software 110E, automatic readings database 110F, calendar database 110G, optimization software 110H, and graphic user interface (GUI) 110J. The wearable device may further include communication modules 130 (e.g., Bluetooth), power 140 (e.g., battery), clock 150, sensors 160, and a display screen 170, among other components or modules.

The communication module 130 facilitates communication (e.g., wireless communication) between the wearable device 100 and other devices (e.g., mobile device) and/or networks. The communication module 130 may be facilitated through the use of one or more antennas. The communication module 130 can facilitate communication with one or more networks or with other devices, for example, by using wireless methods that are known (e.g., Wi-Fi, Bluetooth, 3G, 4G, LTE, ZigBee).

The power supply 140 may be included to provide power for the operation of the wearable device 100. The power supply 140 may be implemented through the use of a lithium ion battery. In some embodiments, the power supply 140 may also be implemented through the use of a capacitor. It may also be possible to have the power supply 140 be capable of being charged or re-charged through the use of an external power source (e.g., battery charger).

Clock 150 may include any type of timekeeper mechanism known in the art for use in, inter alia, determining a present time (e.g., in a given time zone), determining how much time has elapsed between events, determining whether certain predetermined time limits have been met, etc.

The plurality of sensors 160 included with the wearable device 100 are used to monitor and obtain sensor data. The plurality of sensors 160 may be used to evaluate a condition of the user or of an environment in which the user is located. Such sensors 160 may include any combination of, for example, sensors for measuring blood pressure, heart rate, pulse, blood oxygen (e.g., a pulse oximeter), body temperature (e.g., a thermometer), blood sugar, blood glucose (e.g., a glucometer), acceleration (e.g., an accelerometer), insulin, vitamin levels, respiratory rate, heart sound (e.g., a microphone), breathing sound (e.g., a microphone), movement speed (e.g., an accelerometer), movement acceleration (e.g., an accelerometer), steps walked or ran (e.g., a pedometer), skin moisture, sweat detection, sweat composition, nerve firings (e.g., an electromagnetic sensor), or similar health measurements, and other sensors known in the art. In some embodiments, sensors may also measure allergens, air quality, air humidity, air temperature, and similar other environmental measurements. It should be noted that other sensors, not described herein or illustrated in the figures, can also be associated with the wearable device 100.

The display 170 may be used by the wearable device 100 to display various types of information or facilitate interaction between the user and the wearable device 100 (e.g., GUI). In some embodiments, the display 170 can be LED-based, LCD-based or e-paper type display. In other embodiments, the display 170 may be a touch screen display that allows the user to directly interact with the wearable device 100 through physical contact and/or gestures.

The components shown in FIG. 1 are depicted as being connected via a single bus 120. However, the components may be connected through one or more data transport means. As such, some components may be connected via a local microprocessor bus, and others may be connected via one or more input/output (110) buses.

According to an embodiment, the wearable device base software 110A may generally run the basic functions of the wearable device 100, which may include sensor inputs, data analysis, and reporting, among other functions. Such data may be stored in the wearable device database 110B, along with geolocation data and other types of data. Such geolocation data may either directly identify the location of the user (e.g., home or gym) or may be used to determine such location. The database 110B may further store, for example, the current battery percentage. According to one embodiment, if it is determined that the device 100 is currently being charged, the user may be presumed not to be currently wearing the wearable device 100. At that time, the wearable device 100 may input the automatic readings from the wearable device automatic readings database 110F.

If the wearable device 100 is not charging, then the wearable device 100 may go to the charging options selected by the user or preprogrammed into the device (e.g., and maintained in wearable device GUI 110J). The charging options in wearable device GUI 110J may provide for different notifications and timing thereof (e.g., hourly, daily at a certain time, or an identified best time to charge the battery). Different schedules may also be possible, including a schedule based on sensor data (e.g., from sensors 160), preprogrammed data, user input, or pre-existing calendar designated by the user via the GUI (e.g., display 170), or any combination of the foregoing. As one example, the user input or sensor data may indicate where and/or when charging equipment is or is not available. Further, data from the sensors 160 and the inputs from the user (e.g., regarding calendar) may be combined to determine what time and/or location may be optimal for charging. Different priorities may be designated via priority lists. For example, the user may designate the top priority to be the schedule for pulse readings, then blood pressure, calendar, temperature, etc., from sensors 160. Different ways may be set up in which the importance of the different available sensors 160 and calendars are weighted and used to determine when to charge the wearable device 100.

Charging options (e.g., such as those options maintained in wearable device GUI 110J) further allow for inputting of one or more calendars. The user may select the year, month, day, etc., or a range of times. Such options may be used by the user to identify the time periods where the user or wearable device is or is not available to charge the wearable device 100.

According to another embodiment, the wearable device retrieves calendar information from an electronic calendar stored or maintained or modified by the user. For example, the wearable device may access an online or hosted calendar via an API or other approved access point to retrieve information about the user's schedule. As just one example, the wearable device can access an API to integrate with or retrieve information from a Google® or Outlook® Calendar.

The base software 110A may provide data from the wearable device database 110B to the wearable device prediction software 110C, which may include data retrieved the wearable device database 110B regarding the current battery percentage. The current battery percentage and the battery percentage stored on the wearable device database 110B may be used to determine (e.g., via prediction algorithms of wearable prediction software 110C) how much time is left on the charge for the battery (e.g., power 140) at current activity level and settings.

The wearable device database 110B may be searched to retrieve previously entered data. The current time may be identified by a native clock 150. Using such data, one or more prediction algorithms from wearable device prediction software 110C may determine an estimate as to remaining battery life (e.g., of power 140). Such estimate of remaining battery life may be sent to the wearable device base software 110A, and it may be determined whether a schedule from sensor data was selected. If so, the wearable device base software 110A may send the data from wearable device database 110B and the estimate regarding remaining battery life to the wearable device sensor software 110A.

One or more sensor algorithms may be used to determine the times of day that the sensors 160 are in active use. For example, where the sensors 160 do not receive any indication of pulse, such lack of detected data may indicate that the wearable device 100 is not worn by the person at such times of day. Similarly, where the sensor data indicates relatively unchanging levels (e.g., pulse rates) over a certain period of time, such lack of variability may indicate that the user is in a dormant state (e.g., sleeping, relaxing, or otherwise unstimulated state). As such, there may be less of a need to wear the wearable device 100. Such identified time periods may therefore represent an opportunity to charge the wearable device 100 without risking important data readings.

Sensor algorithms may be selected based on the priority list, which may or may not exclude the calendar (e.g., which may be maintained, accessed, or updated via wearable device calendar software 110E). Such sensor algorithms may determine that there is available time currently. If so, a notification (e.g., "charge the wearable device now") may be sent. If time is not currently available, a next available time may be determined, as well as whether current battery life would allow the wearable device 100 to reach the next charging point without having to shut down. If not, then it may send the notification to the user to charge the wearable device 100 now or as soon as possible, notwithstanding current availability. If there is sufficient battery life, then a notification may be sent to charge dependant on the user's charging options (e.g., wearable device GUI 110J).

Further, a calendar-based schedule may be selected (e.g., via wearable device calendar software 110E). As such, the wearable device base software 110A may send the wearable device database 110B and remaining battery life to the wearable device calendar software 110E. For an optimized schedule that combines the sensor data and the calendar, the wearable device optimization software 110H may be executed. Time may be input from the clock 150 to determine if there is free time available now, and if so, a notification may be sent and displayed (e.g., "charge now") on the display screen 170 of the wearable device 100. If free time is determined to currently not be available, the next available free time slot may be determined and a notification may be sent to charge the wearable device 100 at the next available free time slot (e.g., "charge in one hour") and/or at the next available location (e.g., "charge when you arrive at home").

Where a combined schedule was selected, information regarding free time slots may be sent to the wearable device optimization software 110H. As such, the wearable device optimization software 110H may receive the time slots from the wearable device sensor software 110D and the available time slots from the wearable device calendar software 110E. The two sets of time slot data may be compared to identify one or more next matching time slots. If the current time slot is available, a notification may be sent and displayed on display 170 notifying the user to charge the wearable device 100 now. If the current time slot is unavailable, the time slots may be evaluated based on the priority list, including the calendar via wearable device calendar software 110E. It may be determined if there is enough battery power to last until the next available time slot. If not, then a notification may be sent and displayed on display 170 to charge now. If there is enough battery life to last until the next available time slot, a notification may be sent based on the user's charging options (e.g., wearable device GUI 110J).

Figure 2:
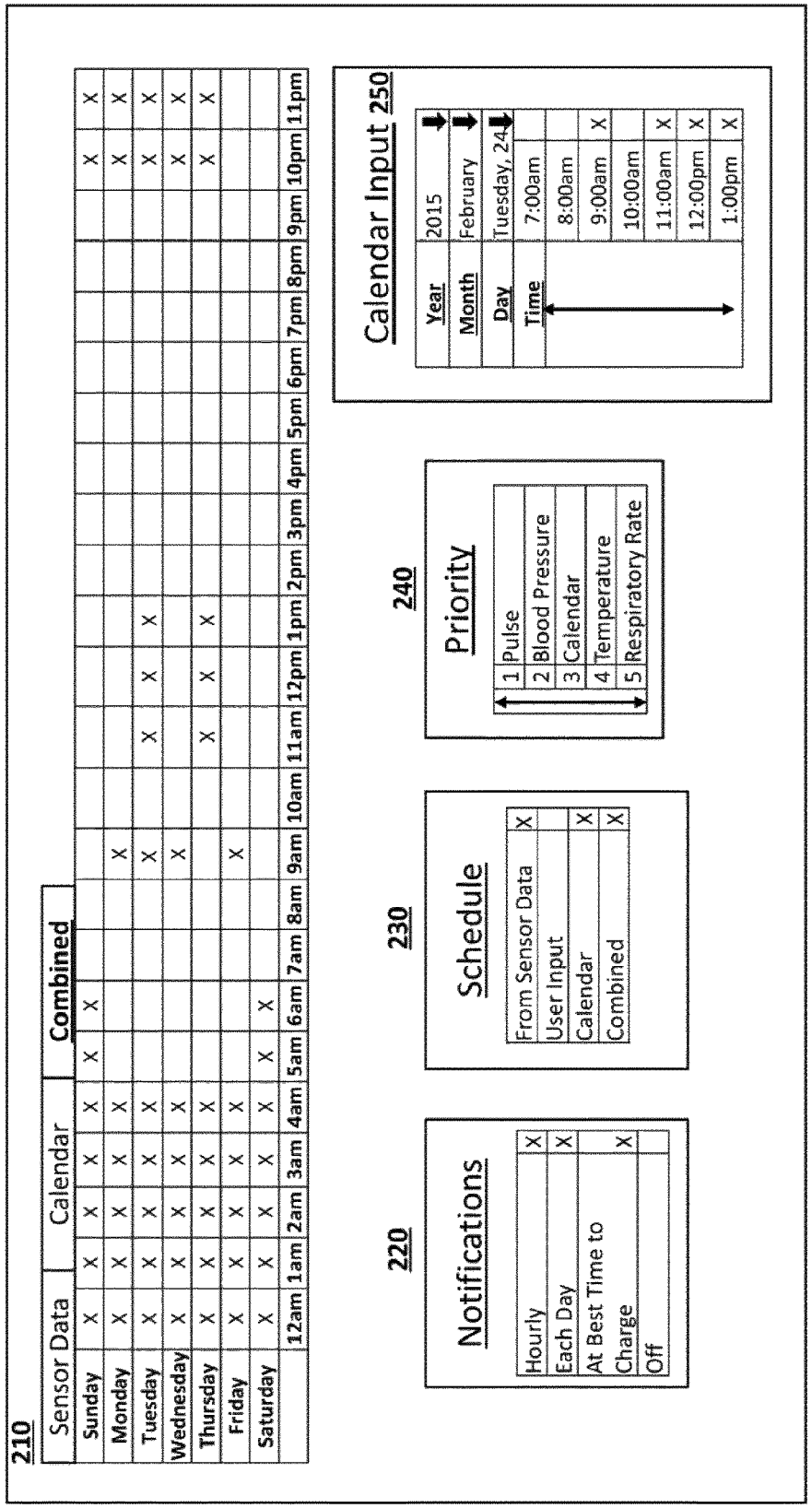
FIG. 2 illustrates a graphic user interface that may be used in a wearable device, in accordance with an embodiment.

FIG. 2 illustrates an embodiment of a graphic user interface 200 that may be used in a system for calendar-based charging for wearable devices (e.g., wearable device 100). The top of the GUI 200 includes tabs 210 for selecting whether the charging decisions are to be made based on sensor data (e.g., detected by sensors 160 and maintained by wearable device sensor software 110D), calendar data (e.g., maintained by wearable device calendar software 110E in wearable device calendar database 110G), or a combination of the two. In the GUI 200 of FIG. 2, the combined setting has been selected. In the illustrated GUI 200, the X's represent suggested time slots available for charging the user's wearable device (e.g., wearable device 100). The open slots have been identified as times during which the user is likely to be wearing the wearable device (e.g., wearable device 100) based on either the calendar or sensor data, and as such, such open slots are likely not to be a convenient time for charging the wearable device (e.g., wearable device 100). If the user were to select on sensor data, then the determination of time slots may change based only on the times that the sensor data is being used. Alternatively, if the user were to select on calendar, then the time slots determined charging availability may be based solely on calendar availability. The combined view combines both the times when the sensors 160 are needed and time when the user may be busy with other matters (e.g., based off calendar availability).

FIG. 2 further illustrates options for notifications 220, schedule 230, priority 240, and calendar input 250. The notifications options 220 allow the user to designate a time period to be notified when it may be a good time to charge. Such notifications may be sent hourly, so that every hour, a notification may be sent to say, "9:00 a.m. this morning may be a good time to charge your device for the rest of the day." The user can select daily notifications at a certain time, so that every day at that time, a notification may be sent to remind the user when the best time to charge their wearable device may be. The user may also select the option of being notified only at the best time to charge. As such, the wearable device may wait until that determined time to display the notification that there is currently available time to charge the wearable device.

The schedule options 230 allow for the schedule to be based on sensor data, user input, calendar, or a combination of any of the foregoing. Sensor data indicates times when the sensors are not being used as often, so that the user may avoid missing any important readings. For example, when the user is at the gym or otherwise engaged in activity during which the user wants to wear the wearable device (e.g., to measure stress or other health conditions). The schedule 230 input may also be input directly from the user (e.g., previously unscheduled gym time or other last-minute appointments).

The calendar option in schedule 230 allow for determinations to be based on calendar data. For a user whose calendar is kept relatively up-to-date, such data may be the best way to determine availability for charging. For example, if the user is in off-site meetings between 11:00 am and 1:00 pm, then the user may not have time to charge the wearable device. The combined option for schedule allows the user to select a combination of different bases for determining charging availability (e.g., combinations of sensor data, user input, and calendar data).

The priority list 240 allows the user to designate the priority by which to use certain data as bases for the determinations of charging availability. For example, the priority list 240 illustrated in FIG. 2 indicates that the user has designated pulse as the number one priority, followed by blood pressure, calendar availability, temperature, and respiratory rate. Such priority 240 allows the wearable device 100 to make determinations where sensor data may conflict with each other. For example, the pulse sensor data may indicate that it is currently a good time to charge, but the respiratory sensor data indicates that it is not a good time to charge. In such situations, the determinations may be based on which set of data is higher on the priority list. As such, since pulse is the top priority, the recommendation may be made to charge even though it may not be a good time for respiratory rate (e.g., the wearable device would otherwise monitor respiratory rate during that time). According to another embodiment, the priority list 240 can be experimentally derived in whole or in part, based on data from the sensors 160. For example, the system may learn that under some circumstances pulse is a better indicator of charging availability, while under other circumstances—or at other times—motion data is a better indicator of charging availability. According to another embodiment, the priority list 240 can be time- and/or activity-dependent, meaning that at certain times of the day, week, or other timeframe, some sensor data may be more indicative of charging availability than other sensor data. This time- and/or activity-dependence may be determined based on user input, a calendar, machine learning, and/or other factors alone or in combination.

The calendar input options GUI 250 allows the user to input directly the times where the user is and is not available. The user may designate the month, day, year, and the time blocks as available time or unavailable time. Such input may or may not be transferred to the calendar, and then into the combined view GUI. While FIG. 2 illustrates an example of entering this information manually, embodiments envisioned herein describe methods of retrieving this information automatically or using another interface.

Figure 3:
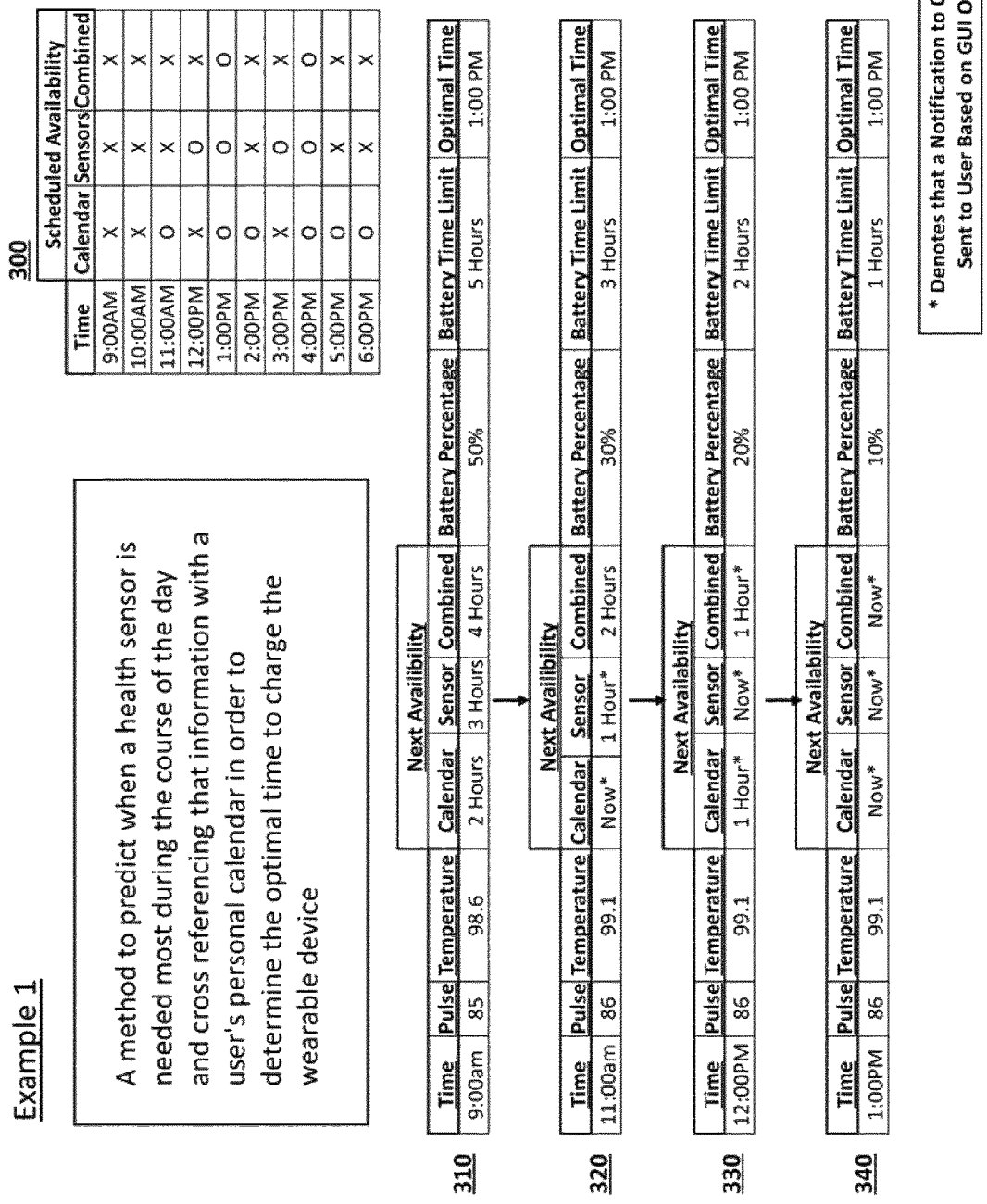
FIG. 3 illustrates an implementation of a method for providing charging information to a user of wearable devices, in accordance with an embodiment.

FIG. 3 illustrates an embodiment of a method for calendar-based charging for wearable devices. As illustrated, the databases may change in order to show how that there is availability to the user to charge their device, depending on the charging options. As such, a prediction may be made as to when a health sensor is needed most during the course of the day, which may then be cross-referenced with calendar data in order to determine the optimal time to charge the wearable device. FIG. 3 includes a chart 300 with scheduled availability based on calendar, sensor, and combined data. The chart includes time slots from 9:00 am through 6:00 pm. The X's indicate that the time slot is not available, while the O's indicate that the time slot is open.

FIG. 3 further includes more detailed charts for each time slot 310-340, with information regarding detected pulse, temperature, time until next available time slot for charging (e.g., based on calendar, sensor, or combination), current battery life by percentage, current battery life by time, and a time slot determined to be optimal for charging.

As illustrated, the different time slots 310-340 may have different data, indicating the change over time. Further, the asterisk (*) may indicate that a notification to charge had been sent to the user based on the charging options (e.g., options menus 220-250 as illustrated in wearable device GUI 200 of FIG. 2). Where the user had selected hourly notifications, an hourly notification may be sent to let the user know when the best time to charge is. Where the determination is based on sensor data, the best time may be determined based on whether the sensor is likely to be needed (e.g., the sensor is usually not used in the next hour), so the notification may be sent with that information. For the combined determination, the determined time may be based on both sensor and calendar data (e.g., the sensor is not used and there is an available calendar entry two hours from now), so a notification may not be sent just yet.

As illustrated, the first time slot 310 is at 9:00 am, and the next time slot 320 is at 11:00 am. At the latter, the battery percentage has decreased to 30 percent, the battery time limit has decreased to 3 hours remaining, but the optimal time determined for charging remains at 1:00 pm. An hour later (e.g., time slot 330 at 12:00 pm), pulse and temperature remains the same, the availability for the calendar is in one hour, and the notification is sent. For the sensor data, the determined time slot is right now, so a notification is sent, and for the combined data, the determined time slot is right now. The battery percentage is 20 percent, because the wearable device has not been charged yet (e.g., because the user has selected the combined option). The battery life has two hours remaining, and the optimal time is still 1:00 pm.

The next chart is for the time slot 330 at 1:00 pm. The pulse and temperature readings are still the same. The next availability for the calendar is now, so notification is sent. For the sensor it is now, so notification is sent. Finally, the combined schedule is now. The battery life percentage is 10 percent, battery life time is one hour remaining, and it leaves optimal time at 1:00 pm. The notification is sent to let the user know that based off the calendar available and sensor availability, that right now is the most optimal time to charge.

Figure 4:
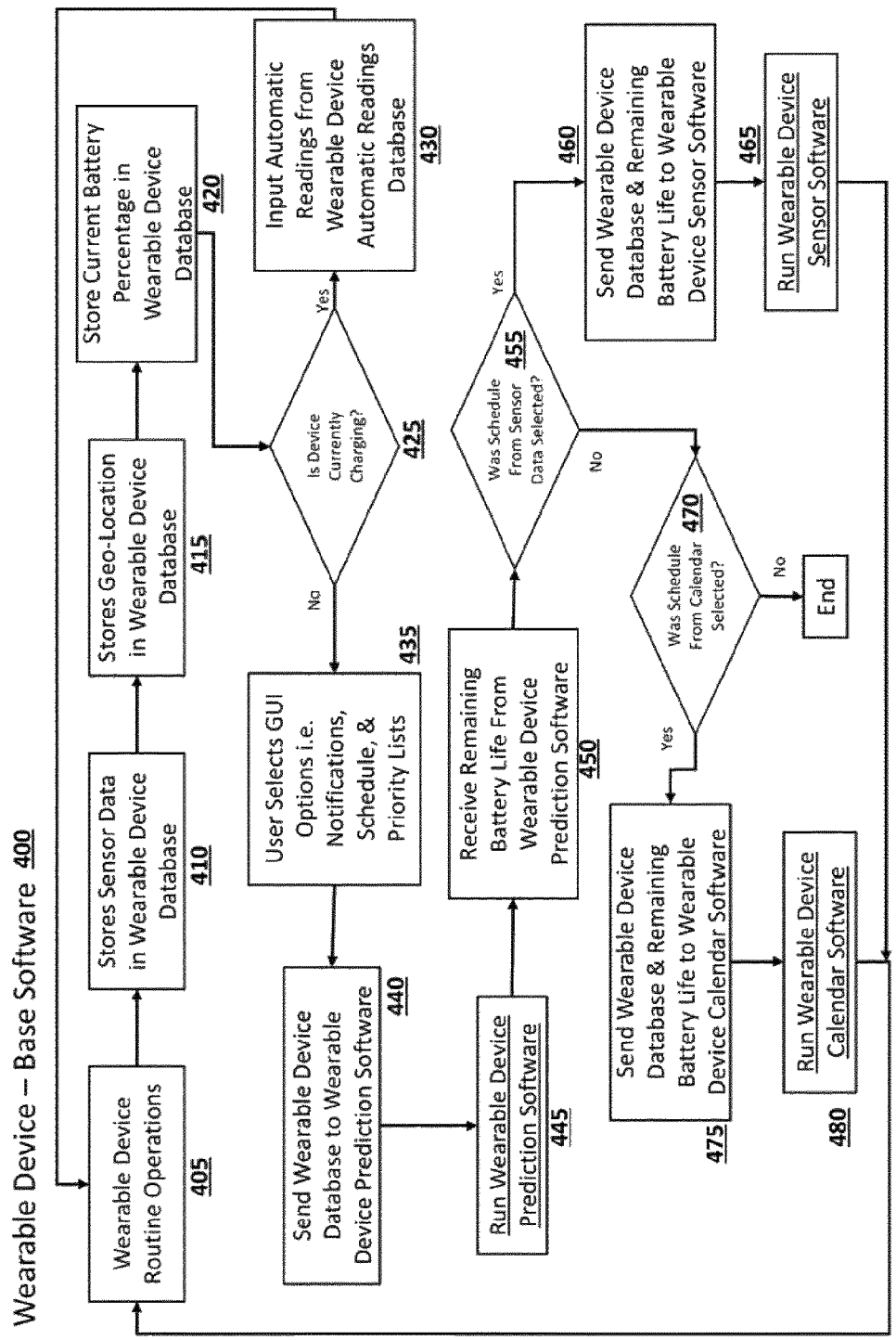
FIG. 4 is a flowchart of a base software method that may be used in a wearable device, in accordance with an embodiment.

FIG. 4 is a flowchart of a base software method 400 that may be used in calendar-based charging for wearable devices (e.g., wearable device 100). The first step 405 begins with wearable device routine operations (e.g., via wearable device base software 110A) in which the routine operations is running the sensor inputs and data analysis and reporting. From there, the method may proceed to the next step 410, where the sensor data is stored in the wearable device database 110B. Then in step 415, the geolocation data may be stored in the wearable device database 110B. The current battery percentage may also be in the wearable device database 110B in step 420. From there, it may be determined in step 425 if the device 100 is currently charging or not. If it is, then most likely the user is not wearing the device 100. As such, the method may proceed to step 430, where automatic readings from the wearable device automatic readings database 110F may be input, and the method may return to the first step 405 to repeat. However, if the device 100 is not charging, then the method may proceed to step 435, in which the user selects the charging options (also called "GUI options") (e.g., maintained via wearable device GUI 110J and which may include options menus 220-250 in FIG. 2). For example, the notifications may be scheduled, as well as options selected for the priority list and the calendar inputs. Alternatively, at step 435 the device may automatically retrieve charging options from a calendar or other source. Step 435 may be performed at any point during or before the method, and may be periodically repeated to update the charging options. Accordingly, the method may go directly from step 425 to step 440.

In step 440, data from the wearable device database 110B may be sent to the wearable device prediction software 110C, which may be run in step 445 to determine the remaining battery life of the wearable device 100. The remaining battery life (e.g., of power 140) from the wearable device prediction software 110C may be received in step 450, and it may be determined in step 455 whether schedule from sensor data has been selected. If yes, the method may proceed to step 460 where data from wearable device database 110B and remaining battery life may be sent to the wearable device sensor software 110D, which may be run in step 465. If no, then the method may proceed to step 470 where it may be determined if the schedule from the calendar was selected. If no, then the method may end. However, if yes, the method may proceed to step 475 where data from wearable device database 110B and remaining battery life may be sent to the wearable device calendar software 110E, which may be run in step 480. Then the method may return to step 405 and repeat. After the wearable device sensor software 110D is run, the method may also go back to step 405 and run the wearable device routine operations.

FIG. 5 is an embodiment of a database 500 that may be used in a system for calendar-based charging for wearable devices (e.g., wearable device 100). The wearable device database 500 may track such data as user ID, date, time, blood pressure, pulse, temperature, respiratory rate, accelerometer, GPS, and battery percentage. For example, the first row includes data for user JSXXXX, dated Feb. 24, 2015, at time 9 am, and the various sensor readings taken at that date and time. Starting with the first row in which the battery life is at 100 percent, subsequent readings may be taken about every five minutes (or other selected time period) to reveal that the battery life percentage may drop as the device is being used over time.

FIG. 5 also includes the wearable device automatic readings database 510. This is if the wearable device base software 110A determines that the device 100 is being charged or if the user is being relaxed and not stimulated, then it may start inputting these predetermined readings in order to conserve battery life. Instead of the sensor readings being taken by sensors 160 for pulse, temperature, blood pressure, respiratory rate, accelerometer, and GPS, an average may be determined or selected for automatic entry into the wearable device database 500.

Figure 6:
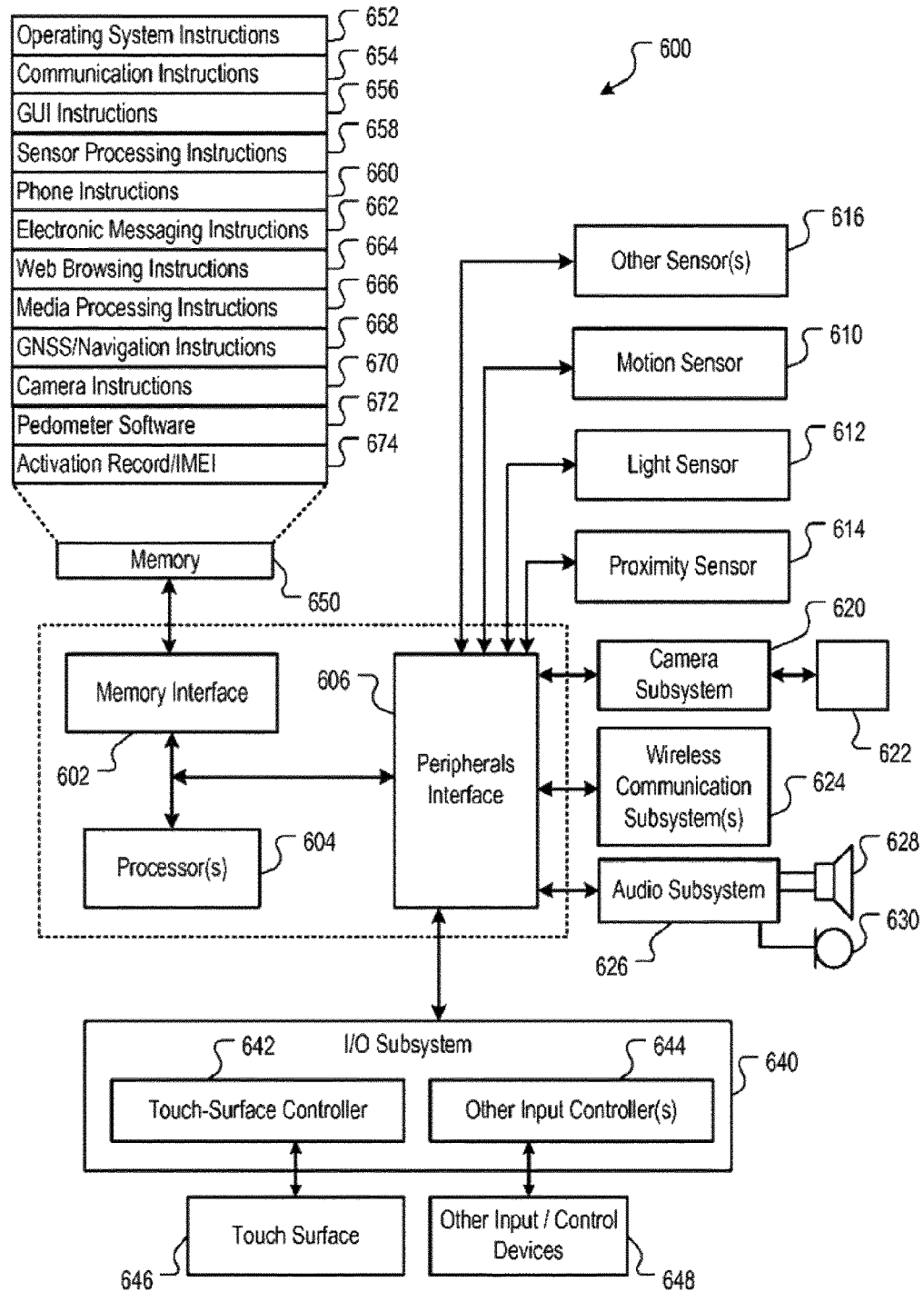
FIG. 6 is a schematic representation of a mobile device architecture, in accordance with an embodiment.

FIG. 6 illustrates an embodiment of a device architecture 600 that may be utilized to implement the various features and processes described herein. Architecture 600 can be implemented in any number of portable devices including but not limited to smart phones, electronic tablets, gaming devices, and wearable devices (e.g., wearable device 100). Architecture 600 as illustrated in FIG. 6 includes memory interface 602, processors 604, and peripheral interface 606. Memory interface 602, processors 604 and peripherals interface 606 can be separate components or can be integrated as a part of one or more integrated circuits. The various components can be coupled by one or more communication buses or signal lines.

Processors 604 as illustrated in FIG. 6 are meant to be inclusive of data processors, image processors, central processing unit, or any variety of multi-core processing devices. Any variety of sensors, external devices, and external subsystems can be coupled to peripherals interface 606 to facilitate any number of functionalities within the architecture 600 of the exemplar device. For example, motion sensor 610, light sensor 612, and proximity sensor 614 can be coupled to peripherals interface 606 to facilitate orientation, lighting, and proximity functions of the device. For example, light sensor 612 could be utilized to facilitate adjusting the brightness of touch surface 646. Motion sensor 610, which could be exemplified in the context of an accelerometer or gyroscope, could be utilized to detect movement and orientation of the device. Display objects or media could then be presented according to a detected orientation (e.g., portrait or landscape).

Other sensors could be coupled to peripherals interface 606, such as a temperature sensor, a biometric sensor, or other sensing device to facilitate corresponding functionalities. Location processor 615 (e.g., a global positioning transceiver) can be coupled to peripherals interface 606 to allow for generation of geo-location data thereby facilitating geo-positioning. An electronic magnetometer 616 such as an integrated circuit chip could in turn be connected to peripherals interface 606 to provide data related to the direction of true magnetic North whereby the device could enjoy compass or directional functionality. Camera subsystem 620 and an optical sensor 622 such as a charged coupled device (CCD) or a complementary metal-oxide semiconductor (CMOS) optical sensor can facilitate camera functions such as recording photographs and video clips.

Communication functionality can be facilitated through one or more communication subsystems 624, which may include one or more wireless communication subsystems. Wireless communication subsystems 624 can include 802.5 or Bluetooth transceivers as well as optical transceivers such as infrared. Wired communication system can include a port device such as a Universal Serial Bus (USB) port or some other wired port connection that can be used to establish a wired coupling to other computing devices such as network access devices, personal computers, printers, displays, or other processing devices capable of receiving or transmitting data. The specific design and implementation of communication subsystem 624 may depend on the communication network or medium over which the device is intended to operate. For example, a device may include wireless communication subsystem designed to operate over a global system for mobile communications (GSM) network, a GPRS network, an enhanced data GSM environment (EDGE) network, 802.5 communication networks, code division multiple access (CDMA) networks, or Bluetooth networks. Communication subsystem 624 may include hosting protocols such that the device may be configured as a base station for other wireless devices. Communication subsystems can also allow the device to synchronize with a host device using one or more protocols such as TCP/IP, HTTP, or UDP.

Audio subsystem 626 can be coupled to a speaker 628 and one or more microphones 630 to facilitate voice-enabled functions. These functions might include voice recognition, voice replication, or digital recording. Audio subsystem 626 in conjunction may also encompass traditional telephony functions.

I/O subsystem 640 may include touch controller 642 and/or other input controller(s) 644. Touch controller 642 can be coupled to a touch surface 646. Touch surface 646 and touch controller 642 may detect contact and movement or break thereof using any of a number of touch sensitivity technologies, including but not limited to capacitive, resistive, infrared, or surface acoustic wave technologies. Other proximity sensor arrays or elements for determining one or more points of contact with touch surface 646 may likewise be utilized. In one implementation, touch surface 646 can display virtual or soft buttons and a virtual keyboard, which can be used as an input/output device by the user.

Other input controllers 644 can be coupled to other input/control devices 648 such as one or more buttons, rocker switches, thumb-wheels, infrared ports, USB ports, and/or a pointer device such as a stylus. The one or more buttons (not shown) can include an up/down button for volume control of speaker 628 and/or microphone 630. In some implementations, device 600 can include the functionality of an audio and/or video playback or recording device and may include a pin connector for tethering to other devices.

Memory interface 602 can be coupled to memory 650. Memory 650 can include high-speed random access memory or non-volatile memory such as magnetic disk storage devices, optical storage devices, or flash memory. Memory 650 can store operating system 652, such as Darwin, RTXC, LINUX, UNIX, OS X, ANDROID, WINDOWS, or an embedded operating system such as VXWorks. Operating system 652 may include instructions for handling basic system services and for performing hardware dependent tasks. In some implementations, operating system 652 can include a kernel.

Memory 650 may also store communication instructions 654 to facilitate communicating with other mobile computing devices or servers. Communication instructions 654 can also be used to select an operational mode or communication medium for use by the device based on a geographic location, which could be obtained by the GPS/Navigation instructions 668. Memory 650 may include graphical user interface instructions 656 to facilitate graphic user interface processing such as the generation of an interface; sensor processing instructions 658 to facilitate sensor-related processing and functions; phone instructions 660 to facilitate phone-related processes and functions; electronic messaging instructions 662 to facilitate electronic-messaging related processes and functions; web browsing instructions 664 to facilitate web browsing-related processes and functions; media processing instructions 666 to facilitate media processing-related processes and functions; GPS/Navigation instructions 668 to facilitate GPS and navigation-related processes, camera instructions 670 to facilitate camera-related processes and functions; and instructions 672 for any other application that may be operating on or in conjunction with the computing device. Memory 650 may also store other software instructions for facilitating other processes, features and applications, such as applications related to navigation, social networking, location-based services or map displays.

Each of the above identified instructions and applications can correspond to a set of instructions for performing one or more functions described above. These instructions need not be implemented as separate software programs, procedures, or modules. Memory 650 can include additional or fewer instructions. Furthermore, various functions of the device may be implemented in hardware and/or in software, including in one or more signal processing and/or application specific integrated circuits.

Certain features may be implemented in a computer system that includes a back-end component, such as a data server, that includes a middleware component, such as an application server or an Internet server, or that includes a front-end component, such as a client computer having a graphical user interface or an Internet browser, or any combination of the foregoing. The components of the system can be connected by any form or medium of digital data communication such as a communication network. Some examples of communication networks include LAN, WAN and the computers and networks forming the Internet. The computer system can include clients and servers. A client and server are generally remote from each other and typically interact through a network. The relationship of client and server arises by virtue of computer programs running on the respective computers and having a client-server relationship to each other.

One or more features or steps of the disclosed embodiments may be implemented using an API that can define on or more parameters that are passed between a calling application and other software code such as an operating system, library routine, function that provides a service, that provides data, or that performs an operation or a computation. The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer may employ to access functions supporting the API. In some implementations, an API call can report to an application the capabilities of a device running the application, such as input capability, output capability, processing capability, power capability, and communications capability.

FIG. 7 is an embodiment of a calendar database 700 that may be used in a system for calendar-based charging for wearable devices (e.g., wearable device 100). This can be based off the GUI (e.g., wearable device GUI 200 in FIG. 2) that allows the user to direct enter calendar data into wearable device calendar database 110G or 700. FIG. 7 provides an overall detailed view 700 of calendar database 110G, where the user may have designated calendar availability (and unavailability) for the upcoming week. For the week of Feb. 22, 2015, availability is indicated from 12 am all the way to 11 pm on Sunday, Monday, Tuesday, Wednesday, Thursday, Friday, and Saturday. On Sunday, the entire day is open. On Monday, the user may have indicated that he or she is busy between 9 am and 12 noon, following which the user may be available again (e.g., lunch). Then between 1 pm and 3 pm, the user may not be available, but subsequent time slots are available for the rest of the day.

Figure 8:
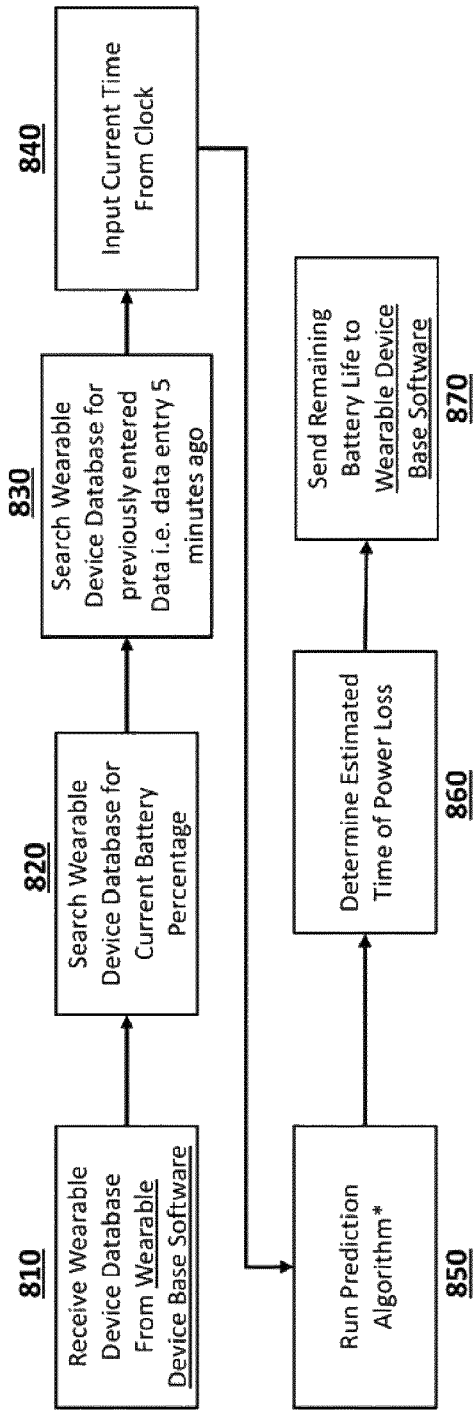
FIG. 8 is a flowchart of a prediction software method that may be used in a wearable device, in accordance with an embodiment.

FIG. 8 is a flowchart of an embodiment of prediction software method 800 (e.g., via execution of wearable device prediction software 110C) that may be used in calendar-based charging for wearable devices (e.g., wearable device 100). In step 810, the wearable device database 110B may be received from the wearable device base software 110A. In step 820, the wearable device database 110B may be searched for the current battery percentage, and in step 830, the wearable device database 110B may be searched for previously entered data (e.g., data in last five minutes). The current time may be input from the clock in step 840. Then in step 850, prediction algorithms (e.g., from wearable device prediction software 110C) may be run. For example, the prediction algorithm may be taking previously entered data, noting the time difference in a percent change in remaining battery power. For example, in five minutes, the battery lowered by one percent. Such data may be used as a base to estimate the remaining battery life in step 860. The remaining battery life may be sent to wearable device base software 110A in step 870.

As just one approximate example, 17 percent remaining multiplied by five minutes equals 85 minutes remaining or an hour and 25 minutes, if the rate of device usage and/or battery depletion is constant. If that is the determination at 12 pm, then the battery may run out at 1:25 pm. It may be determined what the estimated time of power loss may be, and the remaining battery life may be sent to the wearable device base software.

Figure 9:
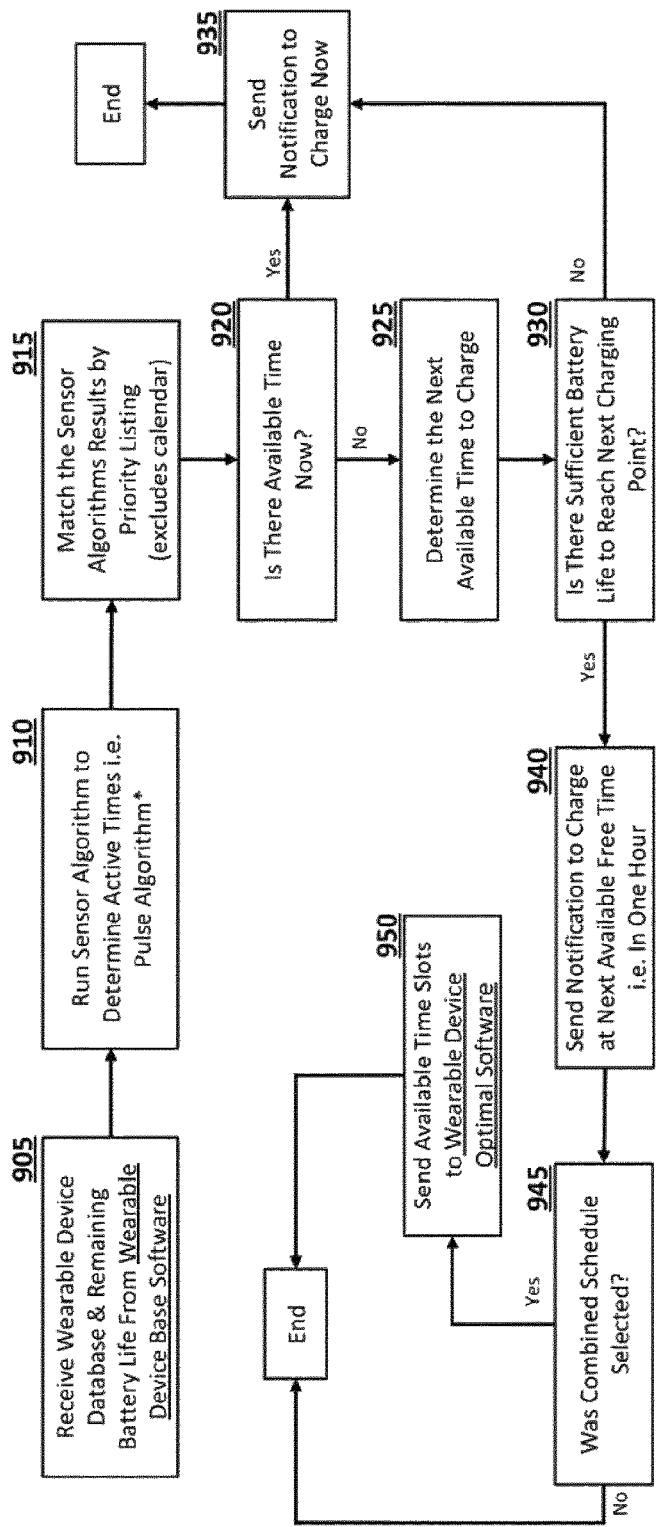
FIG. 9 is a flowchart of a sensor software method that may be used in a wearable device, in accordance with an embodiment.

FIG. 9 is a flowchart of an embodiment of sensor software method 900 (e.g., via execution of wearable device sensor software 110D) that may be used in calendar-based charging for wearable devices (e.g., wearable device 100). In step 905, the wearable device database 110B and remaining battery life may be received from wearable device base software 110A. The sensor algorithms of wearable device sensor software 110D may be run in step 910 to determine active times (e.g., a pulse algorithm). For example, the pulse algorithm may determine the time of day that the pulse sensor is inactive (which can mean that the user was not wearing the wearable device). Alternatively, the pulse sensor readings are stagnant for an extended period of time (e.g., the same pulse reading or close to it for four consecutive hours) may indicate that the user is sleeping, relaxing, or is otherwise not being active or stimulated. There may therefore be less of a need to wear the wearable device, thereby increasing the possibility that the wearable device may be taken off to charge without risking loss of important data readings. In step 915, the sensor algorithm results may be matched by the priority list, excluding the calendar where the determination is to be based off the sensor data. It may be determined in step 920 whether there is available time now to charge. If yes, then the method may proceed to step 935 where a notification may be sent to charge now, and the method may end.

According to an embodiment, step 915 and/or 920 may also comprise an analysis of whether loss of data is acceptable based in whole or in part on one or more goals of the user. For example, the user may have a goal of recording all heart rate data from 11 pm to 8 am every night, and thus daytime charging may be preferred. Alternatively, the user may have a goal of recording all steps during the day, and thus nighttime charging may preferred. The user goals may be provided by the user, preprogrammed into the device, derived experimentally, and/or learned.

However, if there is not available time now to charge, then the method may proceed to step 925 where it may be determined what the next available time to charge may be and step 930, where it may be determined whether there is sufficient battery life to reach the next charging point. If there is not sufficient time, then the method may proceed to step 935, where a notification may be sent to charge now, and the method may end. However, if there is enough battery life, the method may proceed to step 940, where a notification may be sent to charge at the next available free time and also go by the user's GUI options. In step 945, it may then be determined whether the combined option was selected. If the combined option was not selected, then the method may end. If yes (e.g., the combined option was indeed selected), then the method may proceed to step 950 where the available time slots may be sent to the wearable device optimization software 110H, and the method may end.

Figure 10:
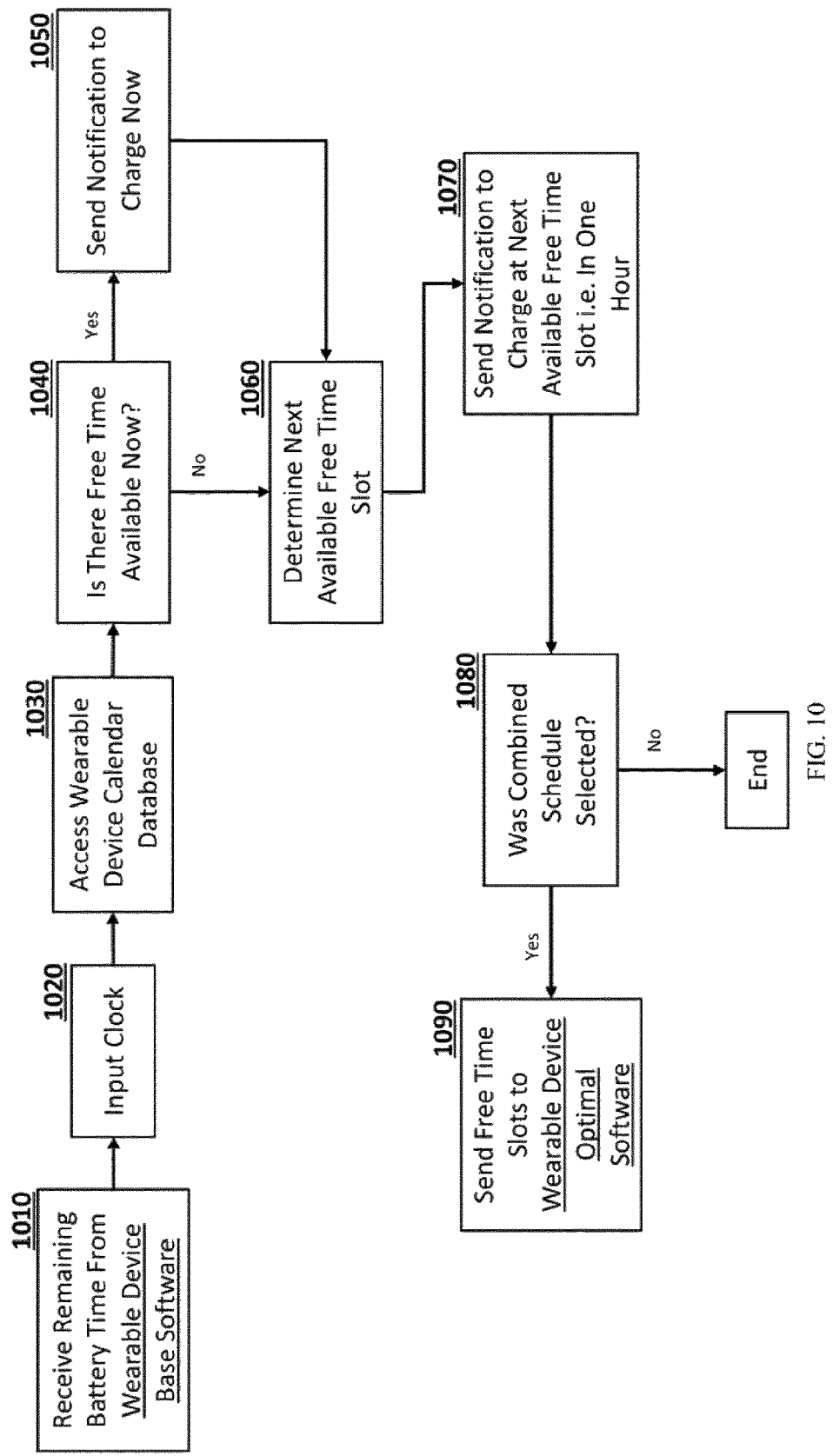
FIG. 10 is a flowchart of a calendar software method that may be used in a wearable device, in accordance with an embodiment.

FIG. 10 is a flowchart of an embodiment of a calendar software method 1010 (e.g., via execution of the wearable device calendar software 110E) that may be used in calendar-based charging for wearable devices (e.g., wearable device 100). In step 1010, the remaining battery time may be received from the wearable device base software 110A. In step 1020, time may be input from the clock 150. In step 1030, the wearable device calendar database 110G may be accessed and used in step 1040 to determine if there is free time available now. If yes, then the method may proceed to step 1050, where a notification may be sent to charge now. If no, then the method may proceed to step 1060, where it may be determined what the next available free time slot may be. In step 1070, a notification may be sent to charge at the next available free time using the user's GUI options (e.g., wearable device GUI 110J).

From step 1050 where the notification to charge now may be sent, the method may also proceed to step 1060 where it may be determined when the next available free slot may be, and a notification may be sent in step 1070 regarding the determined next available time slot to charge depending on the user's charging options. From there, it may be determined in step 1080 whether a combined schedule was selected. If not, then the method may end. If yes, then the method may proceed to step 1090, where the free time slots may be sent to the wearable device optimization software 110H.

Figure 11:
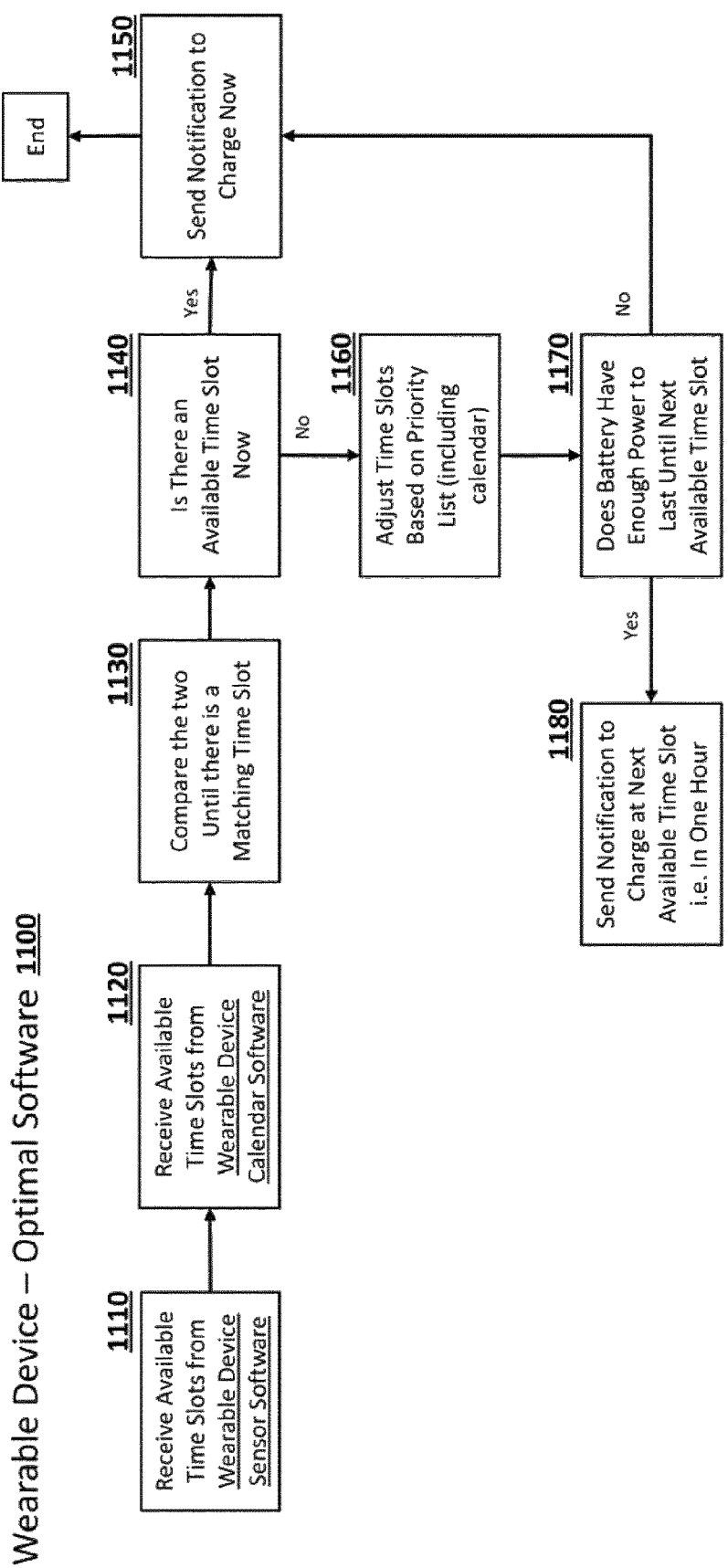
FIG. 11 is a flowchart of an optimization software method that may be used in a wearable device, in accordance with an embodiment.

FIG. 11 is a flowchart of an embodiment of an optimization software method 1100 (e.g., via execution of wearable device optimization software 110H) that may be used in calendar-based charging for wearable devices (e.g., wearable device 100). In step 1110, available time slots may be received from wearable device sensor software 110D, and in step 1120, available time slots may be received from wearable device calendar software 110E. In step 1130, the two set of time slot data may be compared to identify the next matching time slot. It may be determined in step 1140 whether the next available time slot is now. If yes, then the method may proceed to step 1150, where a notification may be sent to charge now, and the method may end.

If the next available time slot is determined in step 1140 to be not now (e.g., at some time in the future), the method may proceed to step 1160 where time slots may be adjusted based on priority list options designated by the user, including the calendar. In step 1170, it may then be determined whether the battery has enough power to last until the next available time slot. If no, the method may proceed to step 1150, where a notification may be sent to charge now, and then the method may end. However, if yes (e.g., there is indeed enough power to last until the next available time slot), the method may proceed to step 1180, where a notification may be sent to charge at the next available time slot or based off the user GUI options.

Figure 12:
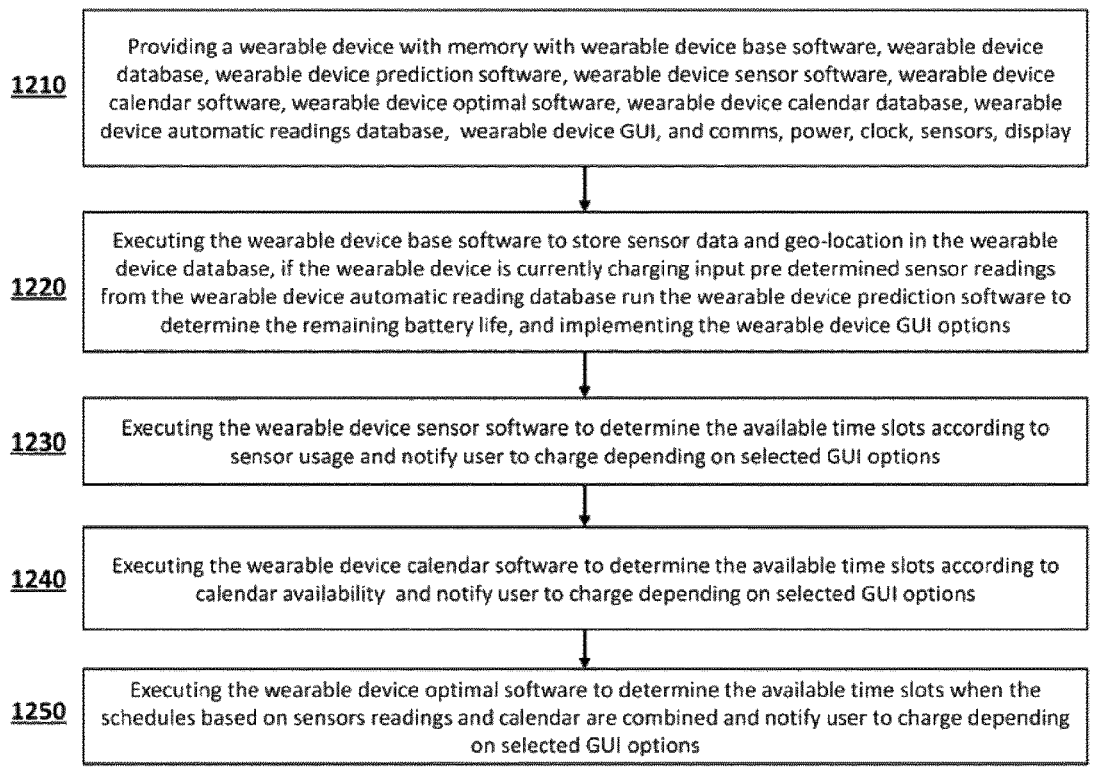
FIG. 12 is a flowchart is a method for providing charging information to a user of a wearable device, in accordance with an embodiment.

FIG. 12 is a flowchart is an embodiment of a method 1200 for calendar-based charging for wearable devices. In step 1210, a wearable device 100 may be provided. The wearable device 100 may be any of the embodiments described or otherwise envisioned herein. For example, the wearable device may be provided with a processor 180 and a memory 110, the memory including a wearable device base software 110A, wearable device database 110B, wearable device prediction software 110C, wearable device sensor software 110D, wearable device calendar software 110E, wearable device optimization software 110H, wearable device calendar database 110G, wearable device automatic readings database 110F, wearable device GUI 110J, and communication modules 130 (e.g., Blue tooth, 3G, LG, Wi-Fi), power 140, clock 150, multiple sensors 160, and a display screen 170.

In step 1220, the wearable device base software 110A may be executed to provide sensor data and geolocation to the wearable device database 110B for storage. If the wearable device 100 is currently charging, predetermined sensor readings may be input from the wearable device automatic readings database 110F. The wearable device prediction software 110C may be run to determine the remaining battery life, and the wearable device GUI options 110J may be implemented.

In step 1230, the wearable device sensor software 110D may be executed to determine the available time slots according to sensor usage and to notify user to charge based on selected charging options. In step 1240, the wearable device calendar software 110E may be executed to determine the available time slots according to calendar availability and to notify the user to charge based on the selected v options. In step 1250, the wearable device optimization software 110H may be executed to determine the available time slots when the schedule is based on sensor readings and calendar combined, as well as to notify the user to charge based on selected charging options 110J.

Figure 13:
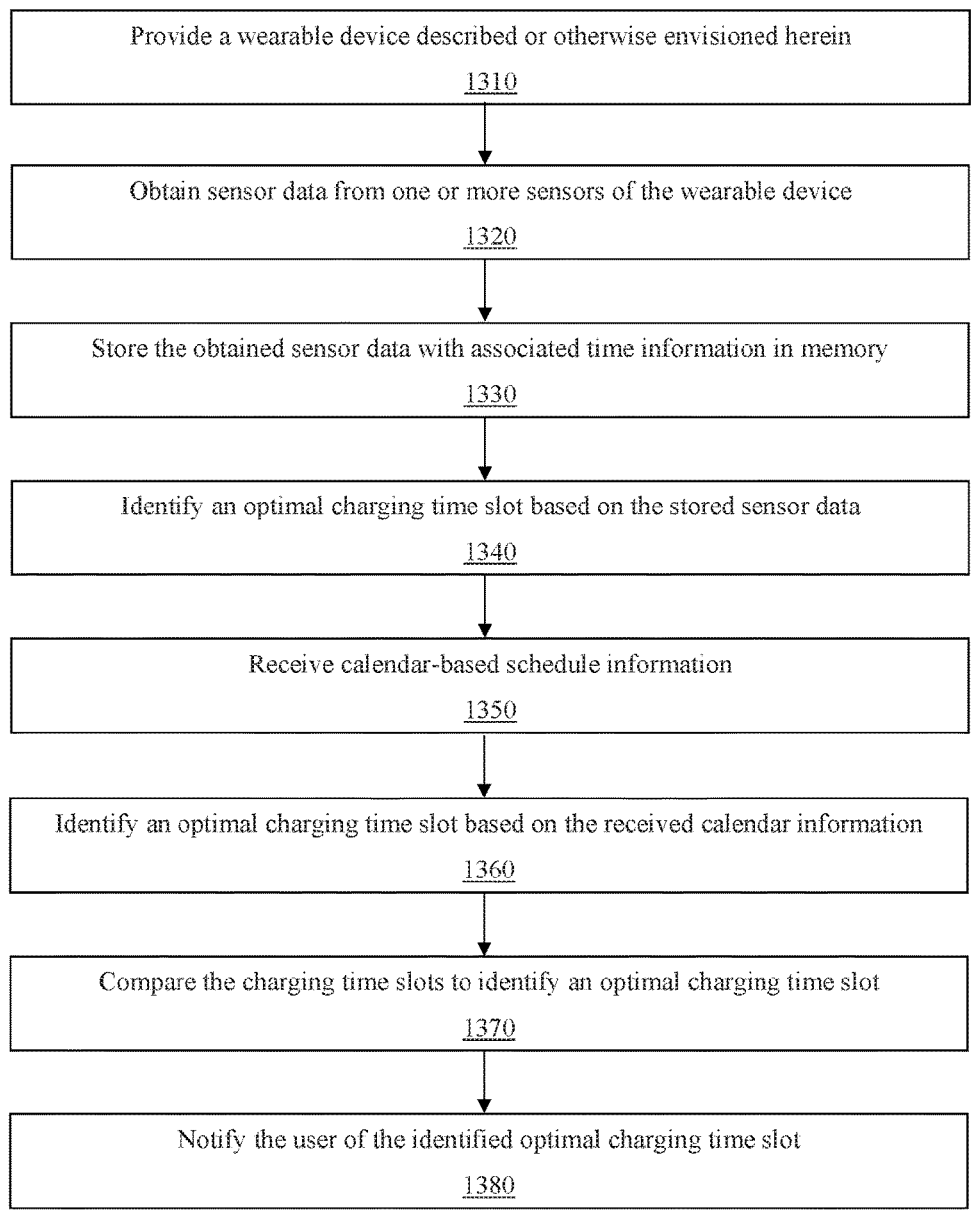
FIG. 13 is a flowchart is a method for providing charging information to a user of a wearable device, in accordance with an embodiment.

FIG. 13 is a flowchart is an embodiment of a method 1300 for charging a wearable device 100. In step 1310 a wearable device 100 is provided, which may be any of the embodiments described or otherwise envisioned herein. For example, the wearable device may be provided with a processor 180 and a memory 110, the memory including a wearable device base software 110A, wearable device database 110B, wearable device prediction software 110C, wearable device sensor software 110D, wearable device calendar software 110E, wearable device optimization software 110H, wearable device calendar database 110G, wearable device automatic readings database 110F, wearable device GUI 110J, and communication modules 130 (e.g., Blue tooth, 3G, LG, Wi-Fi), power 140, clock 150, multiple sensors 160, and a display screen 170, among many other components or modules.

At step 1320 of the method, sensor data is obtained from one or more sensors 160 of the wearable device 100. For example, the sensor may obtain health and/or environmental information about the user and/or environment, such as heart rate, blood pressure, movement, and other sensor data. According to an embodiment, sensor 160 is in continuous or periodic communication with the processor 180. According to an embodiment, processor 180 is a controller or processor in communication with the sensors 160 and one or more other components of the wearable device 10. According to an embodiment, processor 180 may instruct sensor 160 to sample a certain frequency, or the sensor 160 may automatically sample data at a default frequency. Alternately, processor 180 may drive or contact or query sensor 160 for each sample (processor 180 thereby setting the sampling frequency according to the frequency that it instructs sensor 160 to sample). In an alternate embodiment, processor 180 may instruct an intermediate component to query sensor 160 at a particular sampling frequency.

At step 1330 of the method, the wearable device stores the obtained sensor data in memory 110 of the wearable device, although the data may also be communicated and stored remotely. All of the obtained sensor data may be stored, or only some sensor data may be stored. As another embodiment, averages or trends of the sensor data may be stored alone, together with the obtained sensor data, or simultaneously with the obtained sensor data.

At step 1340 of the method, the processor 180 of the wearable device uses the obtained and/or stored sensor data to identify one or more sensor-based time slots during which charging of the wearable device would be optimal. For example, the sensor or user may indicate that charging is not optimal during times of increased activity, heart rate, blood pressure, or other sensor data, and that based on the stored sensor data, historically Tuesdays between 2 pm and 5 pm are periods of low activity. The sensor-based time slot(s) may be based on a wide variety of factors as described or otherwise envisioned herein.

At step 1350 of the method, the wearable device receives calendar-based schedule information. This information may be received from a user via a user interface such as a GUI, or the information may be received from an online or otherwise electronically-stored or available calendar, among other ways to receive this information. The calendar-based schedule information may be stored in memory 110 of the wearable device, although the data may also be communicated and stored remotely. All of the obtained calendar-based schedule information may be stored, or only some calendar-based schedule information may be stored.

At step 1360 of the method, the processor 180 of the wearable device uses the received, stored, or preprogrammed calendar-based schedule information to identify one or more calendar-based time slots during which charging of the wearable device would be optimal. For example, the calendar information may indicate that the user is scheduled to fly tomorrow at 4 pm and is unlikely to be able to charge the device at that time. As another example, the calendar information may indicate that the user has an appointment on Wednesday from 10 am to 10:30 am, and thus the time slot is unavailable. As another example, the calendar information may indicate that the user has no appointments at 2 pm on Thursday and is likely to be in the vicinity of a charger at that time. Many other types of calendar information may be utilized to identify one or more calendar-based time slots, as described or otherwise envisioned herein.

At step 1370 of the method, the processor 180 of the wearable device compares the identified sensor-based time slot(s) to the identified calendar-based time slot(s) to identify one or more time slots that are within both and thus are optimal for charging the wearable device. There may be several restrictions or requirements for the time slot, including a minimum length or access to a charger, among many others.

At step 1380 of the method, the wearable device notifies the user to charge the wearable device at the determined matching optimal time slot. This may be a notification of a future time and/or date, or can be a notification during the identified time slot. The notification may be a notice on a display, a light, a sound, a vibration, or other sensory alert. The notification may be made by the wearable device itself, or the notification may be communicated to another device for delivery to the user.

Additional embodiments and features are possible. For example, predictions and notifications as to optimal times to charge the wearable device 100 may be based on activities and associated calendars. Further, follow-on reminders may be sent to the wearer to charge the wearable device 100. In addition, a calendar of events may be provided for when the charge may go out to another calendar on a second device, phone, or laptop to maintain reminders across platforms.

The wearable device 100 may also share its database(s) of calendar and sensors via the cloud. From such cloud storage or sharing service, a third party network may make the suggested times to charge based upon historical data of many users.

Further, the determinations or predictions as to when battery life will run out may be stored. As such, if the wearable device 100 does shut down for lack of battery power, the user may be notified—when the wearable device 100 is powered back on—that the wearable projected time was violated, thereby motivating the wearer to use the system next time.

In some embodiments, a custom calendar may be generated based on circadian rhythms. Circadian rhythms are physical, mental, and behavioral changes that follow a cycle (e.g., 24 hours) in response to such factors as light and dark patterns in a surrounding environment. Circadian rhythms are found in most living things, including animals, plants, and many tiny microbes. As such, a circadian rhythm cycle may be used to construct a calendar specific to the user based on data regarding context, sleep, light, mood, etc.

It should also be understood that, unless clearly indicated to the contrary, in any methods set forth herein that include more than one step or act, the order of the steps or acts of the method is not necessarily limited to the order in which the steps or acts of the method are recited. It is also not required that each and every step of the method be performed in all embodiments.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claim.

What is claimed is:

1. A computer-implemented method for providing charging information to a user of a wearable device, the method comprising the steps of:

providing a wearable device comprising one or more sensors, a processor, and a memory;

obtaining sensor data from the one or more sensors of the wearable device;

storing the sensor data in a memory of the wearable device, wherein the sensor data is associated with a time information indicating a time slot that said sensor data is obtained;

identifying one or more sensor-based charging time slots, based on the sensor data and the time information associated with the sensor data;

receiving calendar-based schedule information;

identifying one or more calendar-based charging time slots, based on the received calendar-based schedule information;

comparing the identified one or more sensor-based time slots and the one or more calendar-based time slots to determine a matching optimal time slot, wherein the matching optimal time slot is a time before a battery of the wearable device is fully depleted; and notifying the user to charge the wearable device at the determined matching optimal time slot.

2. The method of claim 1, further comprising the steps of:

monitoring a remaining charge of the battery of the wearable device; and generating a prediction as to when the remaining charge of the battery of the wearable device will expire;

wherein the step of notifying the user to charge the wearable device at the determined matching optimal time slot further includes the generated prediction.

3. The method of claim 1, further comprising the step of receiving user input regarding a charging basis, wherein the charging basis is one of a sensor-based charging basis, a calendar-based charging basis, and a combination of a sensor-based charging basis and a calendar-based charging basis.

4. The method of claim 1, wherein the method further comprises the step of determining whether one or more sensors of the wearable device are inactive.

5. The method of claim 1, wherein sensor data from at least two of the one or more sensors of the wearable device are in conflict, and wherein the method further comprises the step of referring to a priority list designating a priority to be consulted when at least two of the one or more sensors of the wearable device are in conflict.

6. The method of claim 5, wherein the determined matching optimal time slot is based at least in part on the priority list.

7. The method of claim 1, wherein the calendar-based schedule information is provided by the user.

8. The method of claim 3, wherein the user input indicates that the charging basis includes a calendar-based charging basis, and the method further comprises the step of referring to one or more user-provided schedules from the predetermined calendar-based schedule information.

9. The method of claim 1, wherein the calendar-based schedule information is retrieved from a calendar database remote from the wearable device.

10. A wearable device comprising:

a battery;

one or more sensors configured to obtain sensor data;

a memory configured to store: the obtained sensor data, wherein the sensor data is associated with a time information indicating the time slot that said sensor data is obtained; and further configured to store calendar-based schedule information;

a processor configured to: identify one or more sensor-based charging time slots, based on the sensor data; identify one or more calendar-based charging time slots, based on the stored calendar-based schedule information; compare the identified one or more sensor-based time slots and the one or more calendar-based time slots to determine a matching optimal time slot for charging the wearable device, wherein the matching optimal time slot is a time before a battery of the wearable device is fully depleted; and generate a notification to a user to charge the wearable device at the determined matching optimal time slot.

11. The wearable device of claim 10, further comprising a display configured to display the generated notification.

12. The wearable device of claim 10, wherein the processor is further configured to:

monitor a remaining charge of the battery of the wearable device; and generate a prediction as to when the remaining charge of the battery will be exhausted; wherein the notification further includes the generated prediction.

13. The wearable device of claim 10, wherein the determined matching optimal time slot is based at least in part on a user-defined priority list.

14. A non-transitory computer-readable storage medium, having embodied thereon a program executable by a processor to perform a method for providing charging information to a user of wearable device, the method comprising the steps of:

obtaining sensor data by one or more sensors of a wearable device;

storing the sensor data in a memory of the wearable device, wherein the sensor data is associated with a time information indicating a time slot that said sensor data is obtained;

identifying one or more sensor-based charging time slots, based on the sensor data and the time information associated with the sensor data;

receiving calendar-based schedule information;

identifying one or more calendar-based charging time slots, based on the received calendar-based schedule information;

comparing the identified one or more sensor-based time slots and the one or more calendar-based time slots to determine a matching optimal time slot, wherein the matching optimal time slot is a time before a battery of the wearable device is fully depleted; and generating a notification to a user to charge the wearable device at the determined matching optimal time slot.

15. The non-transitory computer-readable storage medium of claim 14, wherein the method further comprises the steps of:

monitoring a remaining charge of the battery of the wearable device; and generating a prediction as to when the remaining charge of the battery will be exhausted; wherein the notification further includes the generated prediction.

* * * * *